United States Patent
Mickmann et al.

(10) Patent No.: US 9,500,793 B2
(45) Date of Patent: Nov. 22, 2016

(54) ELECTRONIC MODULE

(71) Applicant: WAGO Verwaltungsgesellschaft mbH, Minden (DE)

(72) Inventors: Viktor Mickmann, Bielefeld (DE); Axel Buchmeier, Heeβen (DE)

(73) Assignee: WAGO Verwaltungsgesellschaft, Minden (DE)

( * ) Notice: Subject to any disclaimer, the term of this patent is extended or adjusted under 35 U.S.C. 154(b) by 86 days.

(21) Appl. No.: 14/519,167

(22) Filed: Oct. 21, 2014

(65) Prior Publication Data
US 2015/0109812 A1  Apr. 23, 2015

(30) Foreign Application Priority Data
Oct. 21, 2013  (DE) .................. 10 2013 111 578

(51) Int. Cl.
*H05K 7/14* (2006.01)
*F21V 8/00* (2006.01)
(Continued)

(52) U.S. Cl.
CPC ....... *G02B 6/0008* (2013.01); *H04L 12/40013* (2013.01); *H05K 5/0217* (2013.01); *H05K 7/1427* (2013.01); *H05K 7/1481* (2013.01)

(58) Field of Classification Search
CPC .. G02B 6/0008; G02B 6/001; G02B 6/0021; G02B 6/0036; G02B 6/0046; H05K 7/1481; H05K 7/1427; H05K 5/0217; H04L 12/40013; B60K 2350/203; B60K 37/02; B60Q 3/044; B60Q 3/042; B60Q 1/0082; B60Q 1/26; G04B 19/30; H01H 2219/062; H01H 2219/056; G02F 1/133603; F21Y 2103/003; G01D 7/00; G21B 11/00

USPC .................................................... 361/679.01
See application file for complete search history.

(56) References Cited

U.S. PATENT DOCUMENTS 6,623,152 B1 * 9/2003 Kroening ............. G02B 6/0021
                                                    362/555
7,293,904 B2 * 11/2007 Beitelspacher ...... G02B 6/0008
                                                    362/555
(Continued)

FOREIGN PATENT DOCUMENTS

DE    3703423    8/1988
DE    4402002    7/1995
(Continued)

*Primary Examiner* — Anne Hines
*Assistant Examiner* — Jose M Diaz
(74) *Attorney, Agent, or Firm* — Renner, Otto, Boisselle & Sklar, LLP.

(57) ABSTRACT

An electronic module (1) for a modular control device is described, in which a multiplicity of electronic modules (1) are connected to one another via a databus. The electronic module (1) has an insulating material housing (21), a printed circuit board (17) which has electronic components in the insulating material housing (21), a conductor connection plane (8) on an upper side (7) of the electronic module (1) having a multiplicity of conductor insertion openings (7) leading to conductor connections (13), and status displays (10) adjacent to the conductor connection plane (8) on the upper side of the electronic module (1). The status displays (10) have a lightguide element (20) with a head section (22) which is accessible from the outside and is installed in the electronic module (1) and with a multiplicity of light-guiding rods (23), which project one next to the other away from the head section (22) and extend down in the direction of the printed circuit board (17) to light elements (24) on the printed circuit board (17).

14 Claims, 11 Drawing Sheets

(51) Int. Cl.
*H04L 12/40* (2006.01)
*H05K 5/02* (2006.01)

(56) References Cited

U.S. PATENT DOCUMENTS

| | | | | |
|---|---|---|---|---|
| 8,425,079 | B2* | 4/2013 | Shiroishi | F21V 33/0052 362/241 |
| 8,678,624 | B2* | 3/2014 | Cave | B23P 11/00 362/240 |
| 8,717,769 | B2* | 5/2014 | Takahashi | G06F 1/1684 361/679.01 |
| 9,071,369 | B2* | 6/2015 | Schlittmeier | H04H 60/04 |
| 2001/0014023 | A1* | 8/2001 | Lange | B60K 37/06 362/489 |
| 2004/0262053 | A1* | 12/2004 | Ludewig | G02B 6/04 180/23 |
| 2009/0244883 | A1* | 10/2009 | Natsume | G02B 6/0018 362/85 |
| 2010/0124029 | A1* | 5/2010 | Gaub | G05B 19/042 361/736 |
| 2010/0134967 | A1* | 6/2010 | Gaub | H05K 1/14 361/679.21 |
| 2011/0141732 | A1* | 6/2011 | Shiroishi | F21V 33/0052 362/235 |
| 2013/0215636 | A1* | 8/2013 | Angelini | G02B 6/0008 362/555 |
| 2014/0307755 | A1* | 10/2014 | Wojcik | H01S 5/02228 372/38.02 |
| 2014/0340928 | A1* | 11/2014 | Proctor | G02B 6/0008 362/581 |
| 2015/0131212 | A1* | 5/2015 | Fu | H01R 13/5202 361/679.01 |
| 2015/0153019 | A1* | 6/2015 | Yoshizumi | G02B 6/0096 362/555 |
| 2015/0362167 | A1* | 12/2015 | Auyeung | F21V 29/502 362/555 |

FOREIGN PATENT DOCUMENTS

| | | |
|---|---|---|
| DE | 19750466 | 5/1998 |
| DE | 10107100 | 12/2002 |
| DE | 102009049456 | 2/2011 |
| EP | 1775513 | 4/2007 |
| EP | 2284953 | 2/2011 |
| WO | 02065593 | 8/2002 |

\* cited by examiner

ELECTRONIC MODULE

This application claims priority of German Application No. 10 2013 111 578.0 filed Oct. 21, 2013, which is hereby incorporated herein by reference.

The invention relates to an electronic module for a modular control device, in which a multiplicity of electronic modules are connected to one another via a databus, wherein the electronic module has an insulating material housing,
a printed circuit board which has electronic components in the insulating material housing,
a conductor connection plane on an upper side of the electronic module having a multiplicity of conductor insertion openings leading to conductor connections, and
status displays adjacent to the conductor connection plane on the upper side of the electronic module.

Such electronic modules are sufficiently known, for example, from DE 44 02 002 B4.

As a rule, status displays, which signal the status of the individual channels of the electronic module, are arranged on the upper side of the electronic modules adjacent to the plane with conductor connection contacts for connecting electrical lines. These status displays are generally realized as light-emitting diodes or the like which are installed in the insulating material housing, on the upper side.

The object of the present invention is to provide an improved electronic module which permits in the case of a particularly simple and compact design, in particular of the installation region with the status displays.

The object is achieved by means of the electronic module having the features of claim 1. Advantageous embodiments are described in the dependent claims.

It is proposed that the status displays have a lightguide element with a head section which is installed in the electronic module, on the upper side, and with a multiplicity of light-guiding rods which project one next to the other away from the head section and extend down in the direction of the printed circuit board to light elements on the printed circuit board.

As a result of the embodiment of the status displays as a single-part lightguide element, a plurality of status displays can be implemented as a single element. In this context, the head section is installed in the upper side of the electronic module. The plurality of light-guiding rods which project one next to the other away from the head section can then be guided individually into assigned light elements such as, in particular, light-emitting diodes on the printed circuit board. The light-guiding rods extend here with, for example, suitable arcuate sections to the assigned light elements.

The head section therefore forms a web which connects the multiplicity of light-guiding webs and which can be installed in the insulating material housing.

As a result, with a single-piece lightguide element a space-saving and simple installation in the upper side of the electronic module is possible, in conjunction with compact and economical electronics on the printed circuit board. In addition, the installation is made easier compared to the use of individual light-guiding rods which have to be installed individually in the electronic module housing, or compared to individual light-emitting diodes which are installed in the electronic device housing.

The cross section of the light-guiding rods can be as desired and can be, for example, rectangular, round or oval.

It is particularly advantageous if the light-guiding rods have alternately different lengths from one another and end alternately offset on the printed circuit board. As a result, the light elements can be arranged in a space saving fashion spatially right next to one another and yet still lead in a space-saving fashion to the common head section of the lightguide element via the individual light-guiding rods as a result of the alternating offset.

It is particularly advantageous if the head section has recesses, for example in the form of annular or rectangular depressions or grooves which each at least partially run around the light exit region of the light-guiding rods. Recesses in the form of cavities improve the quality of a label of the head section. In addition, refraction of the light can be brought about in the light exit region with recesses, in particular in the form of circumferential grooves, in such a way that the light emitted by the light-guiding rod located directly below is visible essentially in the region up to the circumferential recess. Despite the common head section, the individual light spots which are caused by light-guiding rods can therefore be separated from one another optically and reliably assigned to the individual signals.

The head section is preferably installed in the insulating material housing of the electronic module. In this context it is particularly advantageous if the head section is wider than the adjoining light-guiding rods. This results in a side excess dimension at the head section, which excess dimension can be used as a support of the head section on the insulating material housing.

The insulating material housing preferably has a frame-like depression with edge webs which at least partially bound a through-opening for the light-guiding rods and form a support for the side excess dimensions of the head section, adjacent to the light-guiding rods, on the underside of the head section from which the light-guiding rods exit.

It is particularly advantageous if a projection is arranged on at least one of the light-guiding rods, on its outer side. If the lightguide element is installed in the insulating material housing, the at least one projection ensures a predefined alignment of the lightguide element with respect to the insulating material housing. The at least one projection therefore forms a stop with the underside of a frame-like depression of the insulating material housing when the head section is installed in the frame-like depression. The projections therefore engage under the respective upper wall of the insulating material housing in the mounted state, with the result that, in conjunction with the housing edge engaging under the head section, secure positioning of the lightguide in the insulating material housing is provided. In this way, for example, a plane-parallel alignment of the light exit faces with respect to the housing upper side can be ensured under all circumstances.

In one particularly preferred embodiment, the electronic module has a frame-like diaphragm element which is fitted onto the multiplicity of light elements and has side webs. In this context, the side webs are each arranged in the space between two adjacent light-guiding rods and preferably additionally at least partially between two adjacent light elements. The free ends of the light-guiding rods dip into the region surrounded by the side webs of the diaphragm element. In this way, the free ends of the light-guiding rods are held at a predefined setpoint position. In addition, disruptive irradiation from a light element onto an adjacent light element or from a light-guiding rod onto an adjacent light element can be reduced and the light power can be focused onto the assigned light-guiding rod.

It is particularly advantageous if the insulating material housing has signal labels adjacent to the head section. However, it is particularly advantageous if signal labels which are assigned to the individual light-guiding rods are provided on the head section itself. This permits reliable assignment of the light regions to the individual signals.

The electronic module preferably has a carrying rail latching foot for latching onto a carrying rail. In this way, an electronic module is provided which can be combined alongside other electronic modules or terminal strips or the like on a carrying rail to form a control device.

The electronic module preferably has plug-in contacts on the side walls with which a databus can be established when electronic modules are arranged one next to the other in a row on the carrying rail. It is, however, also conceivable that by means of the plug-in contacts a system voltage supply line is made available and guided through the electronic modules in order to supply the electronics of the electronic modules with electrical power for the operation thereof. It is additionally or alternatively conceivable to use plug-in contacts for the power energy supply in order to conduct power energy through the electronic modules and therefore make available at least a power supply for bus users (sensors, actuators, electronic devices and the like) which to make available on at least one of the electronic modules of an arrangement of electronic modules in a row via the conductor connections of the plug-in plane.

The electronic module can be, for example, a field bus controller having a computing unit for executing a control program which can be stored on the controller, a field bus coupler for transmitting data between a superordinate controller and electronic modules which are connected to the databus, an input and/or output module for transmitting data and/or signals between the databus and bus users which can be connected to the input and/or output module or a data conversion module for converting data of the databus into another signal protocol and/or for passing on the data.

The invention will be explained below on the basis of an exemplary embodiment with the appended drawings, in which.

Figure 1:
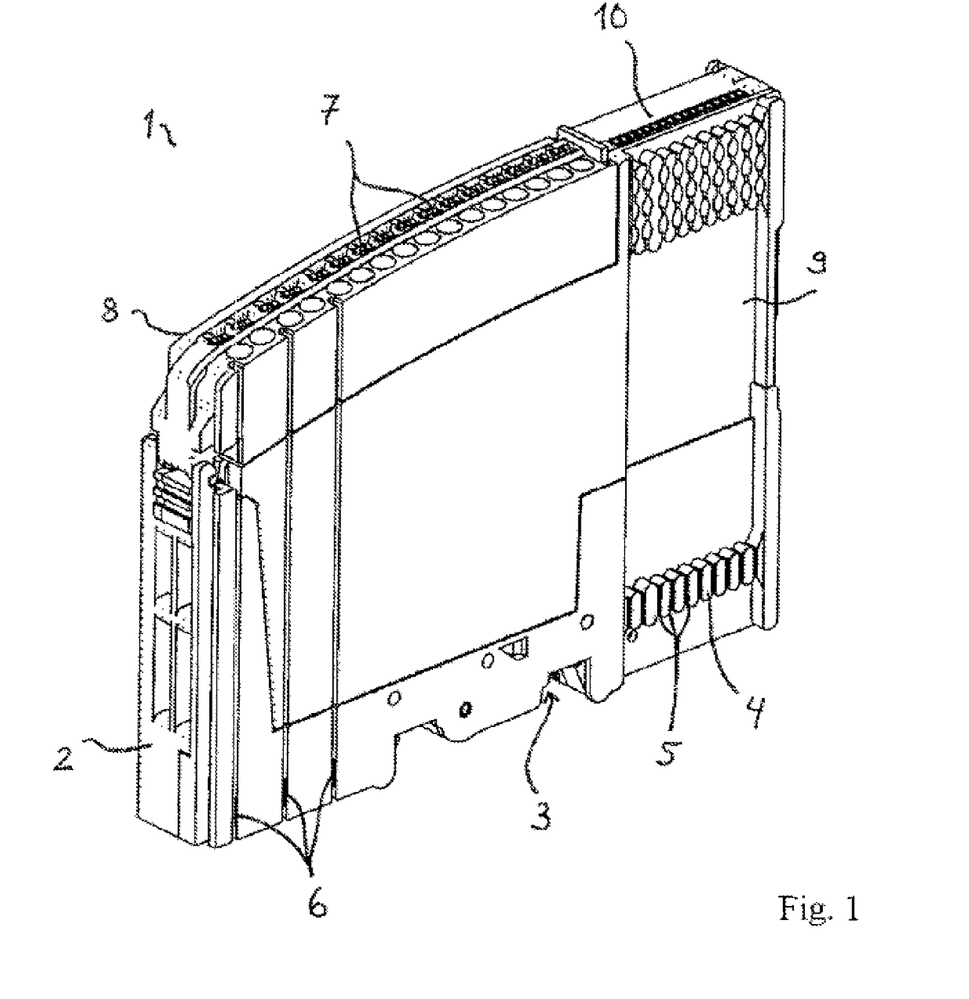
FIG. 1—shows a perspective view of a three-part electronic module for a modular control device.

FIG. 1 shows a three-part electronic module 1 in a perspective view. The electronic module 1 is provided as an input and/or output module for a modular control device. It has a base part 2 with a latching foot 3 which is designed to latch the base part 2 onto a carrying rail. Furthermore, the base part 2 has plug-in contacts 5, arranged between guide webs 4, on the side walls which lie opposite one another, in order, when a plurality of such electronic modules 1 are arranged in a row adjacent to one another on the side walls to connect the plug-in contacts 5 to corresponding plug-in contacts on the opposite side wall of the electronic module 1 and in this way to establish a databus. Via this databus it is then possible to transport data, for example in the form of a ring bus, through the electronic modules 1. In this way, a head module (for example field bus controller or field bus coupler) can pass on data to the electronic modules 1 connected thereto or receive data from these electronic modules 1. In addition, if appropriate an exchange of data is also possible directly between the electronic modules 1 which are arranged adjacent to one another in a row.

Furthermore, a system voltage supply is established via the plug-in contacts 5 in order to make available electrical energy for supplying the electronics installed in the electronic module 1. These electronics are provided, in particular, to receive data from the databus and to output data via the databus and pre-process the received and/or transmitted data. The pre-processing is essentially a signal conversion in order to convert signals from bus users (sensors, actuators or other devices), connected to the electronic module 1, into the communication protocol of the databus, and vice versa. In this context a more wide-ranging logic, such as, for example, predefining timers, threshold value switchers, engine control logic, etc. is also conceivable.

In order to supply power to the bus users which can be connected to the electronic module 1 further plug-in contacts 6 are integrated into the side walls of the base part 2 which lie opposite one another. By plugging together the plug-in contacts 5, 6 which adjoin one another, electrically conductive connections, which pass through a sequence of electronic modules 1, are thus provided, which connections can be tapped as required by the individual electronic modules 1 in order to pass on the electrical power to the connected bus users via conductor connection contacts 13 on the upper side 7 of the electronic module 1, in order to supply said bus users.

These conductor connection contacts 13 are integrated into a separate conductor connection part 8 which forms a conductor connection (plug-in) plane and which can be detachably mounted onto the base part 2 and onto an electronic part 9 which can be fitted onto the base part 2. This has the advantage that when the electronic part 9 is replaced, the individual electrical conductors, connected to the conductor connection part 8, of the connected bus users do not have to be removed individually from the conductor connection part 8. Instead, the entire conductor connection part 8 can be unlatched and removed from the electronic part 9. The electronic part 9 can then be pulled off the base part 2 which is latched onto a carrying rail and can, for example, be replaced. The conductor connection part 8 can subsequently be plugged in again without a large amount of further expenditure in respect of wiring.

The electronic part 9 has a printed circuit board with corresponding system electronics, as has been described above.

For the user it is important that the state of the individual channels which are made available by an electronic module 1 is displayed, i.e. for example the switched state of a channel of an assigned bus user. For this purpose, a display panel with status displays 10 is provided on the upper side of the electronic part 9. These status displays 10 are arranged adjacent to the conductor connection (plug-in) plane.

Figure 2:
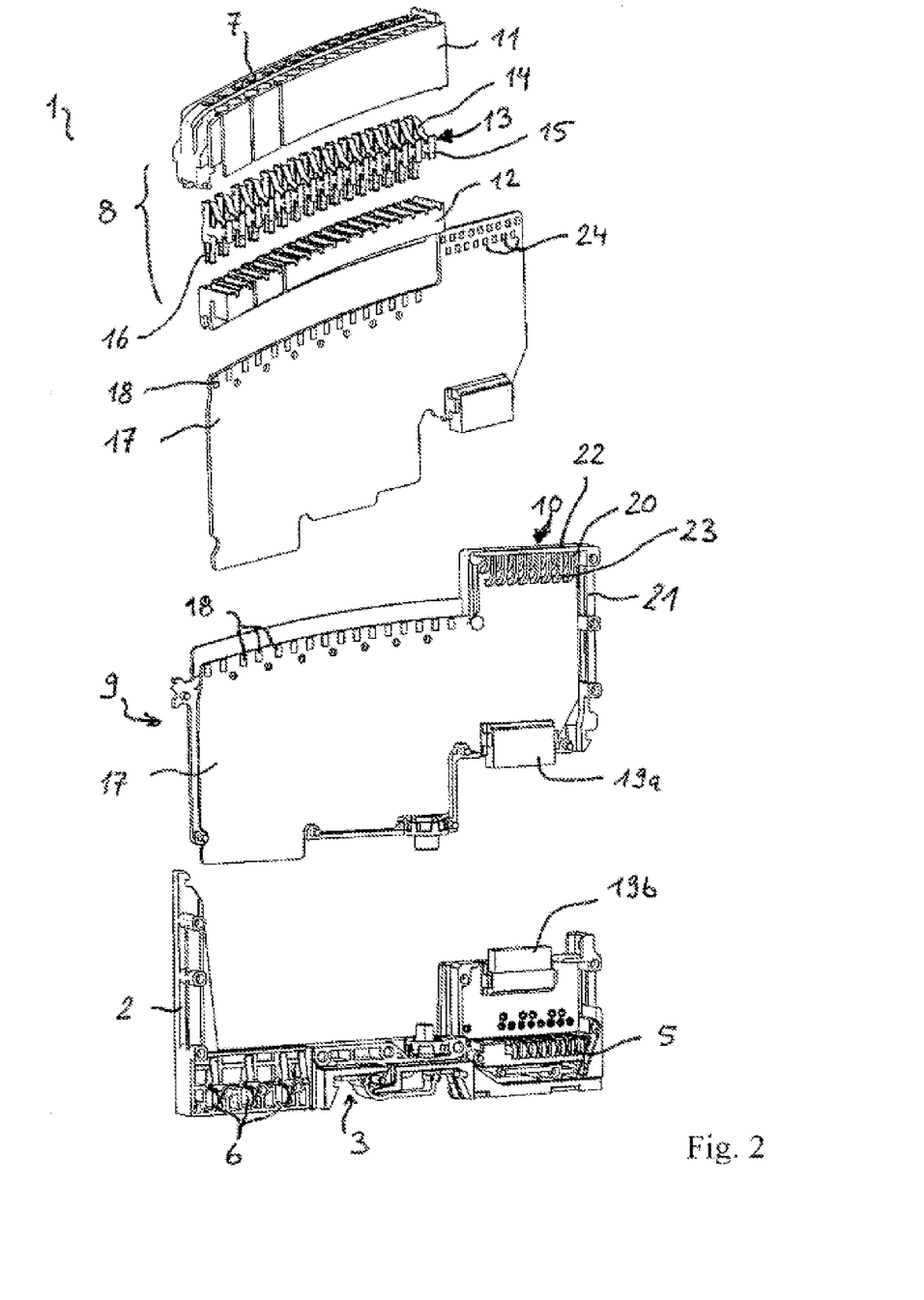
FIG. 2—shows an exploded view of the electronic module from FIG. 1 without a lid and with double illustration of the printed circuit board.

FIG. 2 shows a perspective view of the electronic module 1 in an exploded view. It is clear that the conductor connection plane, i.e. the conductor connection part 8, is formed from an insulating material housing which is composed of an upper part 11 and a lower part 12 and has conductor connections 13, for example in the form of spring connection contacts, inserted therein. The spring connection contacts have clamping springs 14 and a busbar element 15 in order to clamp an electrical conductor, plugged into an assigned conductor insertion opening 7 in the upper part 11, between the clamping spring 14 and the busbar element 15 in an electrically conductive fashion and in the process also secure it mechanically.

A fork contact 16, formed from two spring arms, is present on the underside of the spring connection contacts. Said fork contact 16 is plugged onto the printed circuit board 17, lying below the latter, of the electronic part 9 in order to make electrically conductive contact there with assigned conductor tracks 18.

The electronics on the printed circuit board 17 of the electronic part 9 are connected in an electrically conductive fashion to assigned plug-in contacts 5 in the base part 2 via a plug-in connector 19a, 19b and a further printed circuit board.

The status displays 10 are implemented by means of a lightguide element 20 which is installed in the upper side of the insulating material housing 21 of the electronic part 9. The lightguide element 20 has a common head section 22, from which a number of light-guiding rods 23 protrude, said light-guiding rods 23 extending in the direction of the printed circuit board 17 via, for example, an arcuate section. The free ends of the light-guiding rods 23 which adjoin the bent-over section (bending section 25) each end adjacently to a respectively assigned light element 24 which is applied to the printed circuit board 17. Such light elements 24 are implemented, in particular, as light-emitting diodes and particularly preferably as surface-mounted light-emitting diodes (SMD-LED). The light which is respectively emitted by the individual light elements 24 is guided via the end face of the respective free end of a light-guiding rod 23 to the common head section 24, with the result that the light exits at the upper side of the head section 22 and displays the state of the assigned channel.

Figure 3:
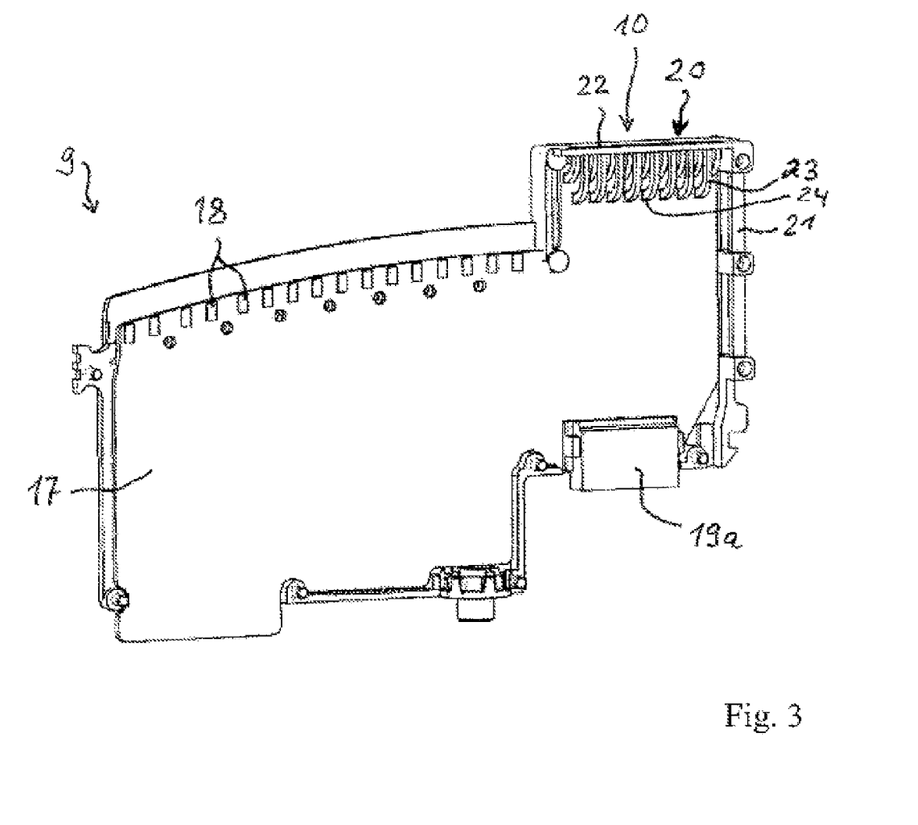
FIG. 3—shows a perspective side view of a printed circuit board with a lightguide element connected thereto.

The mounting of the lightguide element 20 in the insulating material housing 21 of the electronic part 9 can be seen clearly once more in FIG. 3. In the illustrated exemplary embodiment, the individual light-guiding rods 23 exit in a row with a gap, spaced apart from one another, i.e. at distance from one another, from the common head section 22. The light-guiding rods 23 are then alternately embodied with different lengths of extent up to a bending section 25 from which they adjoin an assigned light element 24 with their free end 26. The light elements 24 are correspondingly offset alternately. It is therefore possible to arrange the light elements 24 of a respective row at a larger distance than the distance between two adjacent light-guiding rods 23. This results in the necessary space for the head section 22 being able to be kept very narrow and compact in order to arrange the individual status displays 10. On the other hand, as a result of the arrangement it is also possible to utilize the light elements 24 on the printed circuit board in an optimum way in respect of the necessary routing of the conductors and the space which is necessary, for example, for SMD-LEDs, in order also to use as little area as possible here for the light elements 24.

Figure 4:
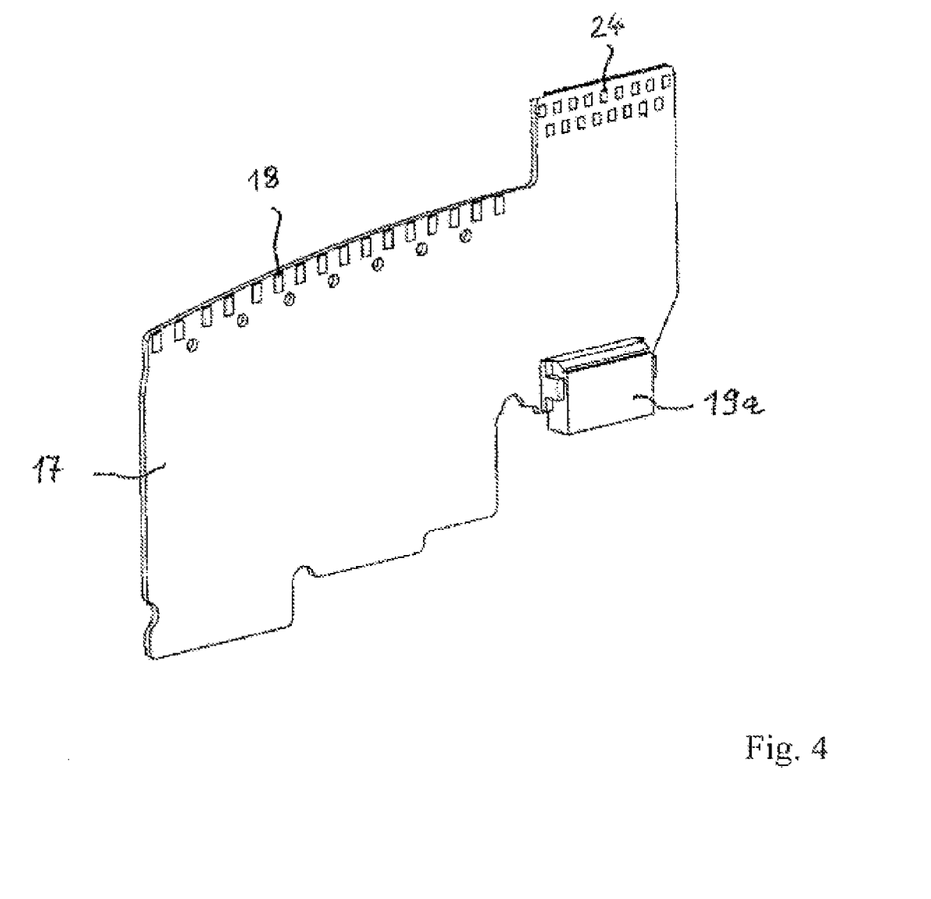
FIG. 4—shows a perspective view of the printed circuit board from FIG. 3 with matrix-like light elements mounted thereon, without a lightguide element.

FIG. 4 provides a perspective view of the printed circuit board 17. Here it becomes clear that the light elements 24 are grouped in two rows one on top of the other. The light elements 24 of the first row are offset alternately here in respect of the light elements 24 of the row adjoining them, with the result that the light elements 24 of an upper row are each arranged above the intermediate space between two light elements of the adjoining lower row.

A multi-row status display 10 in which a single row of light-guiding rods 23 exits one next to the other and without an offset with respect to one another from the head section 22 not only as illustrated in the exemplary embodiment is therefore also conceivable. The same arrangement of a row of light-guiding rods 23 could be provided once more parallel to the first row but with sections which are lengthened compared to the first row of light-guiding rods 23, up to the bending section 25. It is therefore possible to arrange an additional row, for example a double row, under the illustrated double row on the printed circuit board 17, in the case of which double row the individual light elements 24 are each offset in an alternating fashion with respect to the adjacent row.

With the illustrated arrangement of the light elements 24 and of the light-guiding rods 23 it is therefore possible to change a number of light elements 24 which are arranged in an alternately offset fashion in two rows into a single-row arrangement of the status displays 10. In the case of a four-row arrangement of light elements 24 a two-row arrangement of the status displays 10 would result. The number of rows of the light elements 24 is therefore reduced to a halved number of the row of status displays 10.

Figure 5:
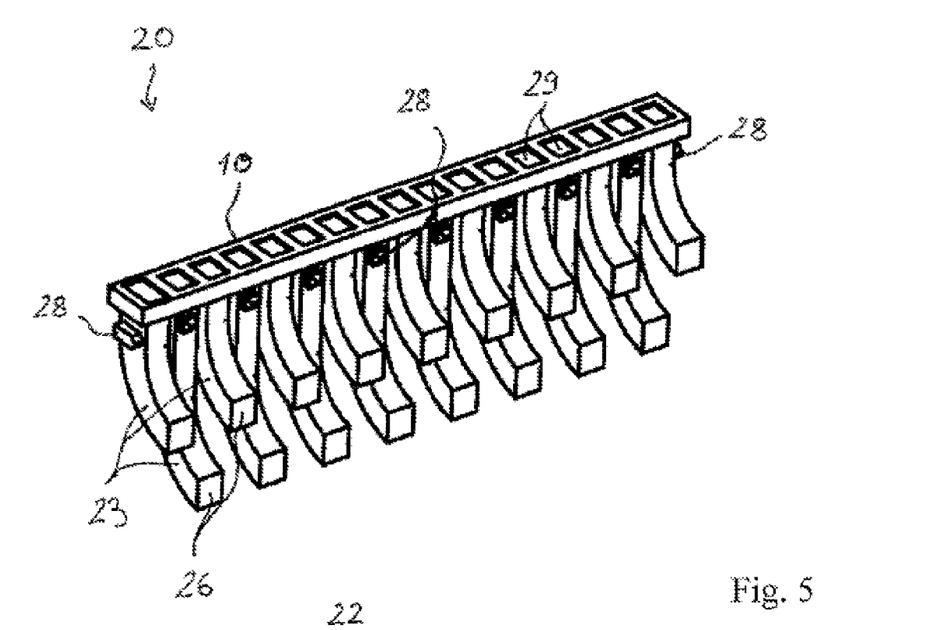
FIG. 5—shows a perspective view of a lightguide element for an electronic module.

FIG. 5 shows a sketch of a lightguide element 20 which has a common head section 22. The head section 22 has, on the upper side, status displays 10 assigned, for example, to the individual channels or overall status of the electronic module 1. These status displays 10 are implemented by the lighting state of the assigned light element 24 and are therefore an integral component of the lightguide element 20. On the side of the head section 22 lying opposite the status displays 10, light-guiding rods 23 project downward. The light-guiding rods 23 have different lengths from one another, in order to end in an alternately offset fashion on the assigned printed circuit board 17. The light-guiding rods 23 each have a bending section 25 adjacent to their free end 26. The bending angle is preferably 110° and is particularly preferably at a right angle with the customary bending tolerance (approximately +/−10%). The end face of the free end adjoins here an assigned light element 24, with the result that the light emitted by the light element 24 exits via the assigned light-guiding rod 23 into the common head section 22 and exits there in the region of the lengthening of the light-guiding rod 23 on the upper side of the head section 22 in order to form an assigned status display 10.

It becomes clear that the head section 22 does not only protrude on the two narrow sides, lying opposite one another, in respect of the light-guiding rods 23 which exit downward. The head section 22 has instead a relatively large width than the downward protruding light-guiding rods 23, with the result that an excess dimension for supporting the head section 22 on an insulating material housing is formed on the longitudinal sides. In this exemplary embodiment, projections 28, which lie at a distance from the underside of the wide head section 22, are preferably arranged on both sides on the outer sides of the respectively longer light-guiding rods 23. In this way, a section of an insulating material housing of the electronic module 1 can dip into the intermediate space, and the head section 22 can be aligned in the insulating material housing. In addition, a projection 28 can also be provided on the narrow sides, on the two outer light-guiding rods 23. The plane-parallel alignment of the light exit faces in relation to the housing upper side is successfully performed by means of these projections 28 in conjunction with the excess dimension of the head module which forms a support.

Figure 6:
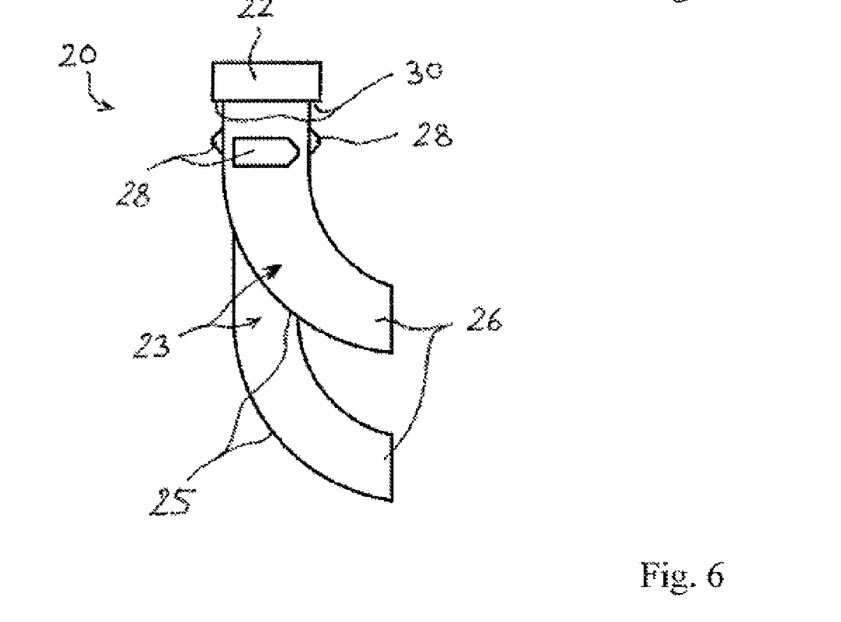
FIG. 6—shows a side view of the lightguide element from FIG. 5.

FIG. 6 shows a side view of the lightguide element 20 from FIG. 5. It is clear here that the head section 22 has a greater width than the adjoining light-guiding rods 23, as a result of which a side excess dimension 30 is formed which serves it from support of the head section 22 on the insulating material housing of the electronic module 1.

The projections 28 on the outer sides of the light-guiding rods 23 are arranged at a distance from the side excess dimension 30, with the result that the projections 28 engage under a respective upper wall of the insulating material housing of the electronic module 1 in the mounted state, and, in conjunction with a housing edge which engages under the web-like head section 22 ensure secure positioning of the lightguide element 20 in the housing of the electronic module 1.

Figure 7:
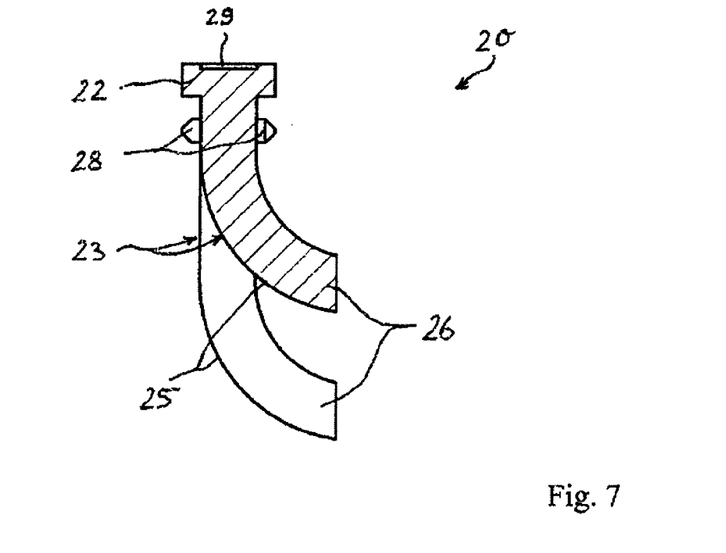
FIG. 7—shows a side sectional view of the lightguide element from FIGS. 5 and 6.

FIG. 7 shows a side sectional view of the lightguide element 20. It becomes clear here that the individual light exit faces in the head section 22 are made deeper by a cavity 29, in order to delineate the individual lights from adjacent light exit faces optically from one another.

It is also clear that the projections 28 run conically at their free end, in order therefore to permit the lightguide element 20 to latch in a frame-like attachment opening in an insulating material housing of the electronic module for the lightguide element 20.

Figure 8:
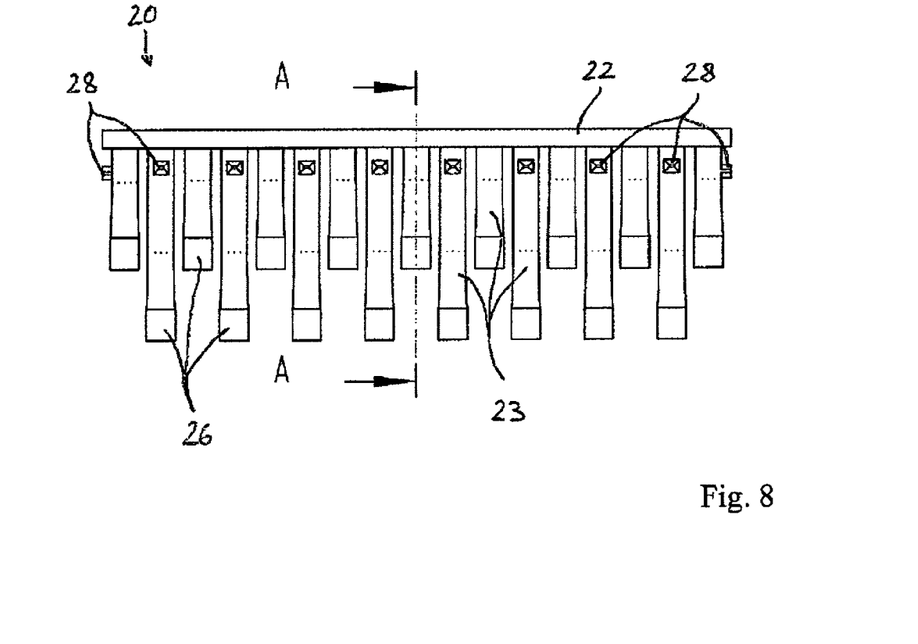
FIG. 8—shows a front view of the lightguide element from FIGS. 5 to 7.

FIG. 8 shows a front view of the lightguide element 20 from FIGS. 5 to 7. It becomes clear that the individual light-guiding rods 23 alternately have a relatively short and a relatively long length, with the result that the free ends 26 of the light-guiding rods end on a printed circuit board 17 in an alternately offset fashion.

The sectional line A-A shows the sectional line for the sectional illustration from FIG. 7.

Figure 9:
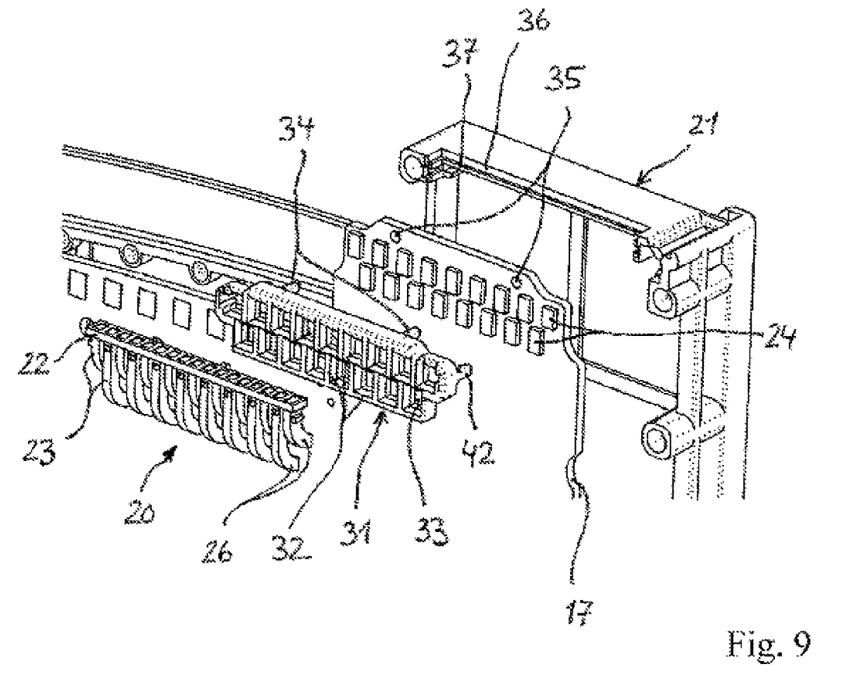
FIG. 9—shows a perspective view of a detail of a further embodiment of an electronic module with a lightguide element and additional diaphragm element in an exploded illustration.

FIG. 9 shows a perspective view of a detail of a further embodiment of an electronic module with the lightguide element 20 described above and an additional diaphragm element 31. It becomes clear that the diaphragm element 31 is frame-like and has side webs 32 which border rectangular receptacle openings 33. When the diaphragm element 31 is fitted onto a printed circuit board 17 in the region of the light elements 24, the light elements 24 dip at least partially into the rectangular openings 33. Side webs 32 are then respectively located in the space between two adjacent light elements 24. This results in light emitted from the light elements 24 not irradiating on adjacent light element and light-guiding rods 23 adjacent thereto. The free ends 26 of the light-guiding rods 23 then dip into the assigned rectangular openings 33 of the diaphragm element 31 and adjoin the upper side of the light element 24, embodied, for example, as light-emitting diodes.

In order to align and secure the diaphragm element 31, securing pins 34 project from the diaphragm element 31 and dip into assigned securing openings 35 in the printed circuit board 17. The securing pins 34 can optionally latch on the printed circuit board 17 through protruding latching arms.

By means of this diaphragm element 31, the position of the lightguide element 20 relative to the printed circuit board 17 and the light elements 24 arranged thereon can also be secured mechanically.

It is also apparent that the insulating material housing 21 of the electronic module 1 has a frame-like depression 36 into which the knob section 22 of the lightguide element 20 dips. The frame-like depression 36 has side webs 37 for forming a system for the protruding excess dimension 30 of the head section 22. The excess dimension 30 therefore rests on the side webs 37 of the frame-like depression 36.

Figure 10:
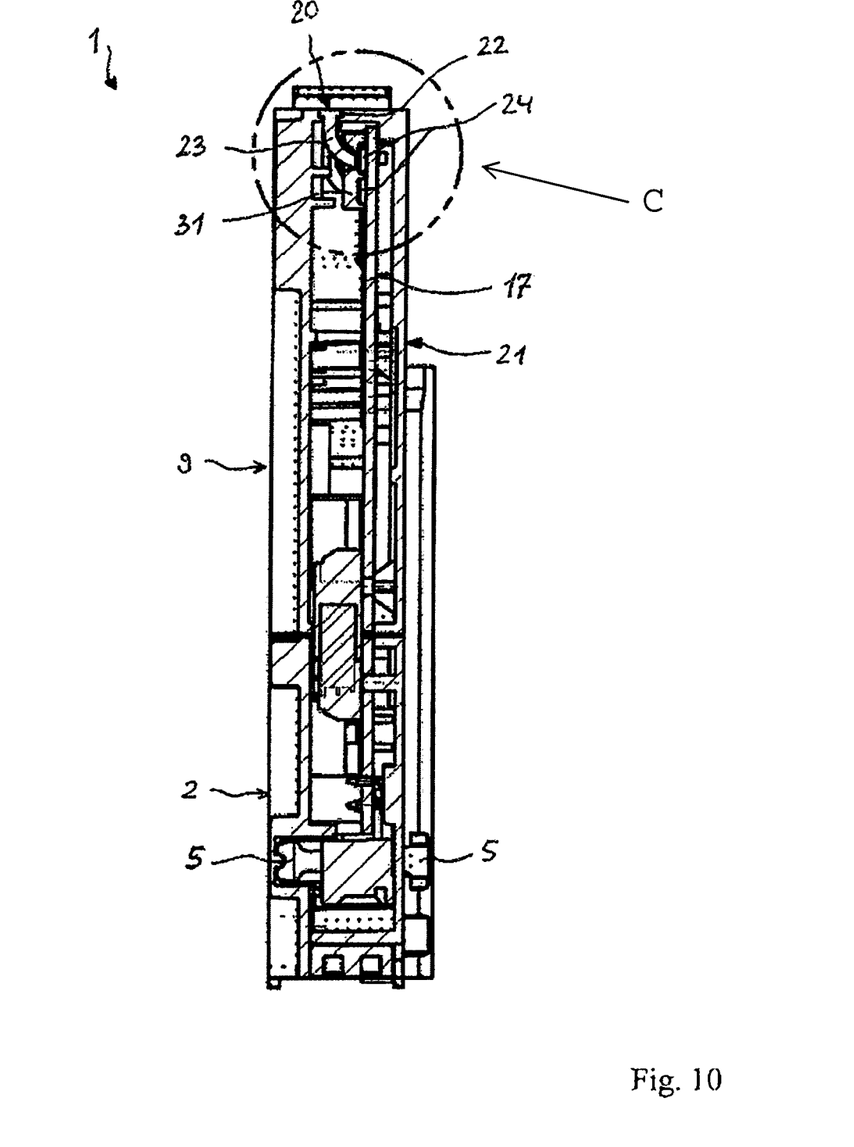
FIG. 10—shows a front sectional view of the electronic module from FIG. 9.

FIG. 10 shows a side sectional view through the electronic module 1 from FIG. 9. It becomes clear that in the installed state the light-guiding rods 23 dip with their free end 26 into the assigned openings in the diaphragm element 33 and adjoin an assigned light element 24.

Figure 11:
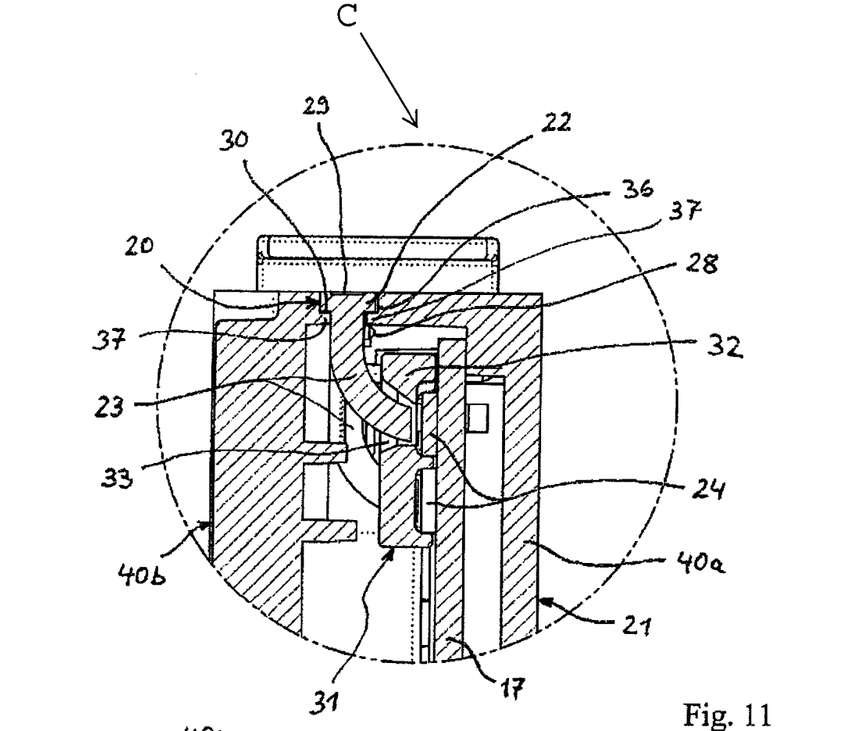
FIG. 11—shows a detail sectional view of the electronic module from FIGS. 9 and 10 in the assembled state in detail C.

FIG. 11 shows a sectional view in the detail C of the electronic module 1 from FIG. 10. In this context, it becomes clearer once more that the receptacle openings bounded by the side webs 32 bound an opening 33 which tapers conically in the direction of the light element 24. It is also clear that the insulating material housing 21 is in two parts and has a rear-side housing shell 40a and a front-side housing shell 40b. The dividing plane of the housing shells 40a, 40b runs here through the frame-like depression 36.

It also becomes clear that the head section 22 dips into a frame-like depression 36 in the insulating material housing 21 on the upper side of the two housing shells 40a, 40b. The edge web 37 of the depression 36 form here a support for the excess dimension 30 of the head section 22. The projections 28 on the outside of the light-guiding rods 23 adjoin the underside of the edge webs 37 and therefore engage under the edge webs 34.

Figure 12:
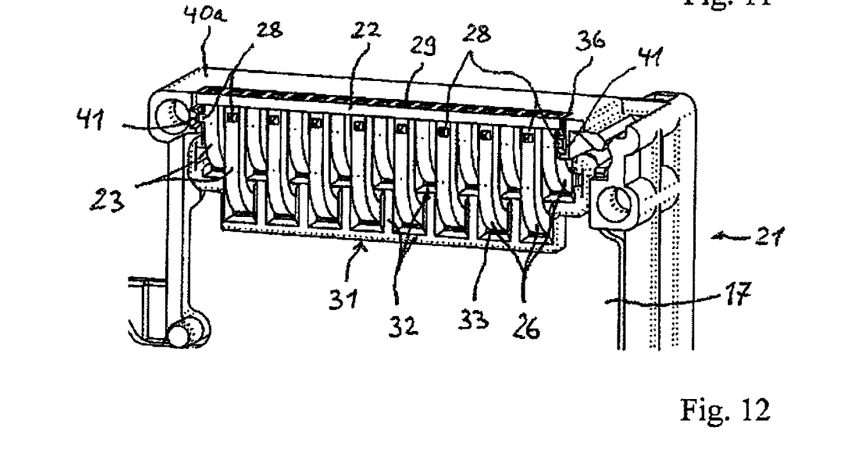
FIG. 12—shows a perspective view of a detail of the electronic module from FIGS. 9 to 11 in the region of the lightguide element with the lid removed.

FIG. 12 shows a perspective side view of a detail of the electronic module 1 from FIGS. 9 to 11 in the region of the lightguide element 20. It becomes clear that the lightguide element 20 dips with its web-like head section 22 into the frame-like depression 36 in the housing half 40a of the insulating material housing 21 and is supported there. The projections 28 which are present on the narrow sides of the lightguide element 20, on the side faces of the outer light-guiding rods 23 are inserted here guide grooves 41 in the insulating material housing 21 in a further embodiment. The guide grooves 41 have an insertion funnel which tapers conically and which facilitates the insertion of the projections 28 into the guide grooves 41 and therefore the insertion of the lightguide element 20 into a predefined setpoint position.

It also becomes clear that the free ends 26 of the light-guiding rods 23 dip into assigned openings 33 of the frame-like diaphragm element 31 and are positioned there in terms of their end position by the diaphragm element 31. A web 32 of the diaphragm element 31 is arranged in each case between adjacent light-guiding rods 23.

Figure 13:
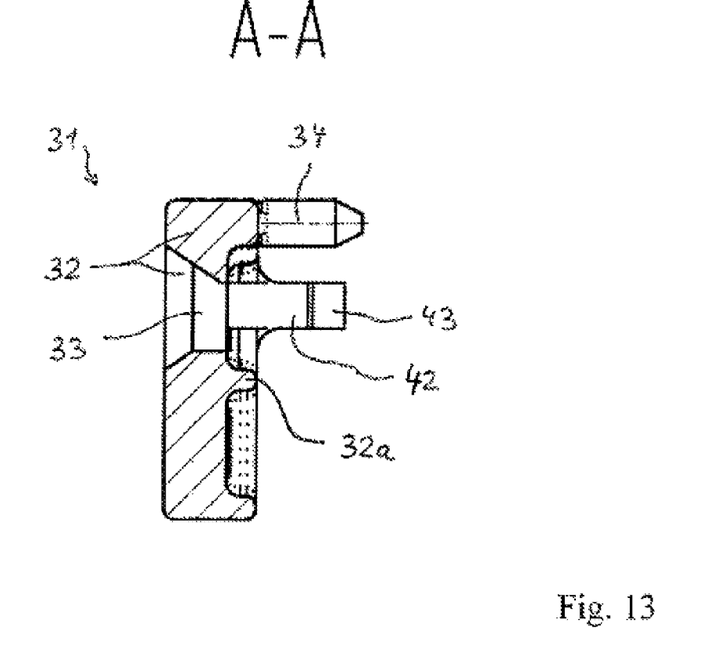
FIG. 13—shows a side sectional view of a diaphragm element for the electronic module from FIGS. 9 to 12.

FIG. 13 shows a side sectional view of the diaphragm element 31. It becomes clear that the openings 33 for accommodating the free ends 26 of an assigned light-guiding rod 23 taper conically toward the outside. In this context, the suitable run-in ramp is longer, adjacent to the inner radius of the curvature of an assigned light-guiding rod 23, than the inclined run-in ramp on the opposite side. This is due to the fact that the lightguide element 20 should be of as compact a design as possible and therefore the straight-lined sections of the free ends 26 of the light-guiding rods 23 are as short as possible, with the result that the inner radius of the curvature are located within the space adjoining by the webs 32.

It is also apparent that securing pins 34, which are provided for insertion into corresponding securing holes 35 of an adjacent printed circuit board 17, project from the underside of the diaphragm element 31. The securing pins 34 (attachment pins) have, for example, a head end which tapers conically, in order to facilitate the plugging into an assigned securing opening (securing openings). As a result of the construction of the diaphragm element 31 from plastic material it is possible to implement a form fit of the diaphragm element on the printed circuit board 17 through a suitable size of the assigned securing openings 35 in the printed circuit board 17.

It is also clear that elastic spring latching clips 42 with a protruding latching projection 43 are present on each of the end sides. In the plugged-in state, the protruding latching projections 43 engage behind the rear side of the printed circuit board in order to latch the diaphragm element on the printed circuit board 17.

Figure 14:
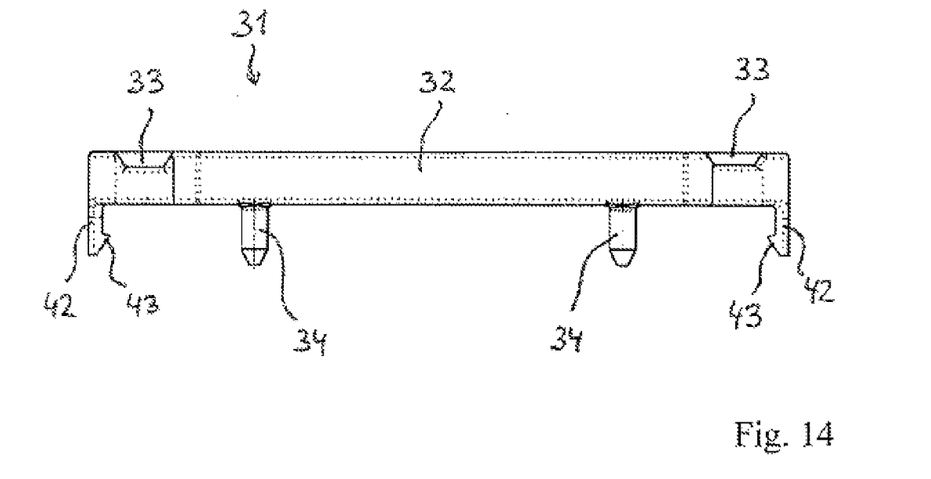
FIG. 14—shows a plan view of the diaphragm element from FIG. 13.

FIG. 14 shows a plan view of the diaphragm element 31 from FIG. 13. Here, it becomes clear once more that spring-elastic latching arms 42 are arranged on each of the two narrow sides lying opposite one another, the latching projections 43 of which latching arms 42 point toward one another. It also becomes clear that securing pins 34 project on the side lying opposite the insertion openings of the openings 33.

Figure 15:
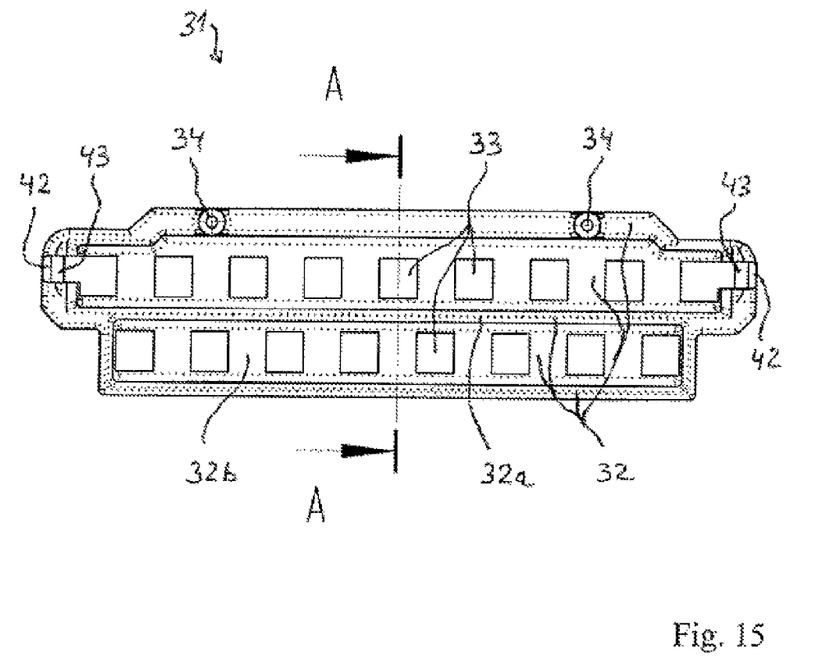
FIG. 15—shows a view of the underside of the diaphragm element from FIGS. 13 and 14.

FIG. 15 also shows a view of the underside of the diaphragm element 31 from FIGS. 13 and 14. It becomes clear here that the openings 33 are arranged alternately offset with respect to one another in two rows. In this way, a very compact design for the largest possible number of light elements 24 is achieved. It also becomes clear that the two lines of openings 33 which lie one below the other are separated from one another by a transverse web 32a. The vertical web 32b between two adjacent openings 33 have a smaller extent compared to the central transverse web 32 and the outer webs 32 and do not extend up to the surface of an assigned printed circuit board 17. Nevertheless, these vertical webs 32b ensure that the adjacent light-guiding rods 23 are positioned. It is also possible to provide here, for the improved optical separation of the adjacent light elements 24, that the vertical webs 32b extend down to the upper side of the printed circuit board.

Furthermore, the sectional line A-A for the sectional illustration from FIG. 13 can be seen in FIG. 15.

In order to be able to delineate better from one another the individual light fields which are generated in the head section 22 it is advantageous if the head section 22 has a partially circumferential recess in the light exit region of the respective light-guiding rods 23. Such a recess can simply be brought about by means of grooves formed in the upper side of the head section 22. This brings about refraction of the light in the region of the recess, with the result that the light emitted by a light-guiding rod 23 lying below it is focused on the region inside the recess.

However, it is also conceivable that the head section 22 has elevated portions or cavities 29 for delimiting individual light exit faces and for forming status displays 10 which can be delimited from one another.

It is optionally possible for the head section 22 or the adjoining upper side of the insulating material housing to have signal labels which are assigned to the individual light-guiding rods 23. In this way, the signal labels can assign the light exit faces to individual channels or functions of the electronic module 1 if light exit faces display, for example, the status of the individual channels or point to the system voltage status of the electronic module 1, in order to display whether the electronic module 1 is switched on or not.

The invention claimed is:

1. An electronic module for a modular control device, in which a multiplicity of electronic modules are connected to one another via a databus, wherein the electronic module has
   an insulating material housing,
   a printed circuit board which has electronic components in the insulating material housing,
   a conductor connection plug-in plane on an upper side of the electronic module having a multiplicity of conductor insertion openings leading to conductor connections, and
   status displays adjacent to the conductor connection plug-in plane on the upper side of the electronic module,
   wherein the status displays have a lightguide element with a head section which is accessible from the outside and is installed in the electronic module and with a multiplicity of light-guiding rods, wherein the light-guiding rods project one next to the other away from the head section and extend down in the direction of the printed circuit board to light elements on the printed circuit board, wherein a first light-guiding rod of the multiplicity of light-guiding rods is arranged between at least two other light-guiding rods of the multiplicity of light-guiding rods, the first light-guiding rod being longer than each of the at least two other light-guiding rods.

2. The electronic module according to claim 1, wherein the adjacent light-guiding rods have alternately different lengths from one another and end alternately offset on the printed circuit board.

3. The electronic module according to claim 1, wherein the head section has in each case cavities, elevated portions or at least partially circumferential recesses in the light exit region of the light-guiding rods.

4. The electronic module according to claim 1, wherein the head section is installed in the insulating material housing.

5. An electronic module for a modular control device, in which a multiplicity of electronic modules are connected to one another via a databus, wherein the electronic module has
   an insulating material housing,
   a printed circuit board which has electronic components in the insulating material housing,
   a conductor connection plug-in plane on an upper side of the electronic module having a multiplicity of conductor insertion openings leading to conductor connections, and
   status displays adjacent to the conductor connection plug-in plane on the upper side of the electronic module,
      wherein the status displays have a lightguide element with a head section which is accessible from the outside and is installed in the electronic module and with a multiplicity of light-guiding rods, wherein the light-guiding rods project one next to the other away from the head section and extend down in the direction of the printed circuit board to light elements on the printed circuit board, and
      wherein the head section is installed in the insulating material housing and the head section is wider than the adjoining light-guiding rods.

6. The electronic module according to claim 5, wherein the head section dips into a frame-like depression in the insulating material housing.

7. The electronic module according to claim 1, wherein a projection for fixing the lightguide element to the insulating material housing is provided on an outer side of at least one light-guiding rod.

8. The electronic module according to claim 7, wherein the head section dips into a frame-like depression in the insulating material housing, and in that the at least one projection forms a stop with the underside of the frame-like depression of the insulating material housing when the head section is installed in the frame-like depression.

9. The electronic module according to claim 1, wherein the insulating material housing has, adjacent to the head section or on the head section, signal labels which are assigned to the individual light-guiding rods.

10. The electronic module according to claim 1, wherein the light elements are light-emitting diodes accommodated on the printed circuit board.

11. An electronic module for a modular control device, in which a multiplicity of electronic modules are connected to one another via a databus, wherein the electronic module has
an insulating material housing,
a printed circuit board which has electronic components in the insulating material housing,
a conductor connection plug-in plane on an upper side of the electronic module having a multiplicity of conductor insertion openings leading to conductor connections, and
status displays adjacent to the conductor connection plug-in plane on the upper side of the electronic module,
wherein the status displays have a lightguide element with a head section which is accessible from the outside and is installed in the electronic module and with a multiplicity of light-guiding rods, wherein the light-guiding rods project one next to the other away from the head section and extend down in the direction of the printed circuit board to light elements on the printed circuit board, wherein a frame-like diaphragm element with side webs is fitted onto the multiplicity of light elements, wherein the side webs are each arranged in the space between two adjacent light-guiding rods, and the free ends of the light-guiding rods dip into the regions which are surrounded by the side webs of the diaphragm element.

12. The electronic module according to claim 1, wherein the electronic module has a carrying rail latching foot for latching onto a carrying rail.

13. The electronic module according to claim 1, wherein the electronic module has plug-in contacts on side walls for establishing a databus when electronic modules are arranged one next to the other in a row on a carrying rail, and for making available a system voltage supply line in order to make available electrical power for supplying the electronic modules, and/or for making available a power energy supply for bus users which can be connected to at least one of the electronic modules arranged in a row, via the conductor connections.

14. The electronic module according to claim 1, wherein the electronic module is a field bus controller having a computing unit for executing a control program which can be copied on the field bus controller, a field bus coupler for transmitting data between a superordinate controller and the electronic modules which are connected to the databus, an input and/or output module for transmitting data and/or signals between the databus and bus users which can be connected to the input and/or output module or a data conversion module for converting data of the databus into another signal protocol and/or for passing on the data.

\* \* \* \* \*